(12) United States Patent
Huang et al.

(10) Patent No.: US 6,489,085 B2
(45) Date of Patent: Dec. 3, 2002

(54) THERMAL REFLOW PHOTOLITHOGRAPHIC PROCESS

(75) Inventors: I-Hsiung Huang, Kaohsiung (TW); Anderson Chang, Miaoli Hsien (TW); Chien-Wen Lai, Taipei Hsien (TW); Anseime Chen, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 35 days.

(21) Appl. No.: 09/742,960

(22) Filed: Dec. 20, 2000

(65) Prior Publication Data

US 2002/0076656 A1 Jun. 20, 2002

(51) Int. Cl.⁷ .................................................. G03F 7/40
(52) U.S. Cl. ........................................ 430/322; 430/330
(58) Field of Search ................................. 430/311, 322, 430/330

(56) References Cited

U.S. PATENT DOCUMENTS 6,348,301 B1 * 2/2002 Lin ............................. 430/330

* cited by examiner

*Primary Examiner*—Kathleen Duda
(74) *Attorney, Agent, or Firm*—Charles C. H. Wu; Wu & Cheung, LLP

(57) ABSTRACT

A thermal flow photolithographic process. A thermal flow photoresist is provided. A cross-linking agent is added to the thermal flow photoresist to form a high-temperature cross-linking photoresist material. A substrate having an insulation layer thereon is provided. The high-temperature cross-linking photoresist is deposited over the insulation layer. The cross-linked photoresist layer on the insulation layer is exposed to light, chemically developed and then heated to cause thermal flow.

7 Claims, 2 Drawing Sheets

THERMAL REFLOW PHOTOLITHOGRAPHIC PROCESS

BACKGROUND OF THE INVENTION

1. Field of Invention

The present invention relates to a photolithographic process. More particularly, the present invention relates to a thermal flow photolithographic process.

2. Description of Related Art

The fabrication of semiconductor can be separated into four major modules including diffusion, etching, thin film and photolithography. Photolithographic process includes the transfer of a pattern from a mask to a silicon chip so that the silicon chip can be etched in an etching module or dopants can be implanted in a thin film module. Hence, precision of pattern transfer in the photolithographic process will directly affect the final quality of the semiconductor circuits.

As the level of integration of integrated circuits continues to increase, the line pitch of bit lines, word lines, doped regions and capacitors is reduced correspondingly. Therefore, resolution of stepping machines must be increase to reproduce finer patterns. However, an increase in the resolution of a stepping machine will result in a loss in depth of focus. On the contrary, increasing depth of focus to obtain a better pattern transfer accuracy will result in a lower resolution. Aside from increasing the resolution of a stepping machine, better pattern transfer results can also be obtained by performing a thermal flow process to reduce line width of pattern on the photoresist layer.

To reduce pattern line width on a photoresist layer by thermal flow method, a photomask pattern is first transferred to a photoresist layer. A soft baking process is carried out and then the photoresist layer is developed. The photoresist layer is heated to a temperature above the glass transition temperature (Tg) on a hot plate. Ultimately, the photoresist layer will begin to flow and reduce the line width of the pattern.

Nevertheless, thermal flow is very temperature sensitive. In other words, minor temperature variation may result in large dimensional change in the pattern ultimately. Hence, process window for thermal flow is quite narrow (between 1° C. to 2° C.). In general, a hot plate is accurate to within 0.4° C. to 0.5° C. Thus, if a uniform line width is required in each silicon wafer after thermal flow, temperature of the hot plate must be precisely controlled. However, the demand for such a high precision increases not only the difficulties in fabricating the semiconductor devices, but also increases the cost of production.

SUMMARY OF THE INVENTION

Accordingly, one object of the present invention is to provide a thermal flow photolithographic process. A thermal flow photoresist is provided. A cross-linking agent is added to the thermal flow photoresist to form a high-temperature cross-linking photoresist material. A substrate having an insulation layer thereon is provided. The high-temperature cross-linking photoresist is deposited over the insulation layer. The cross-linked photoresist layer on the insulation layer is exposed to light, chemically developed and finally heated to cause a thermal flow.

Since the high-temperature cross-linking photoresist contains polymers with cross-linking functional groups, glass transition temperature of the photoresist is increased due to the cross-linking of polymers. Ultimately, process window for thermal flow is widened.

In addition, besides increasing glass transition temperature, the cross-linking of polymers also strengthens internal bonding strength of the photoresist layer. Hence, the photoresist layer is less vulnerable to attack by etching agents. Consequently, a higher etching selectivity ratio between the photoresist layer and the insulation layer is obtained.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
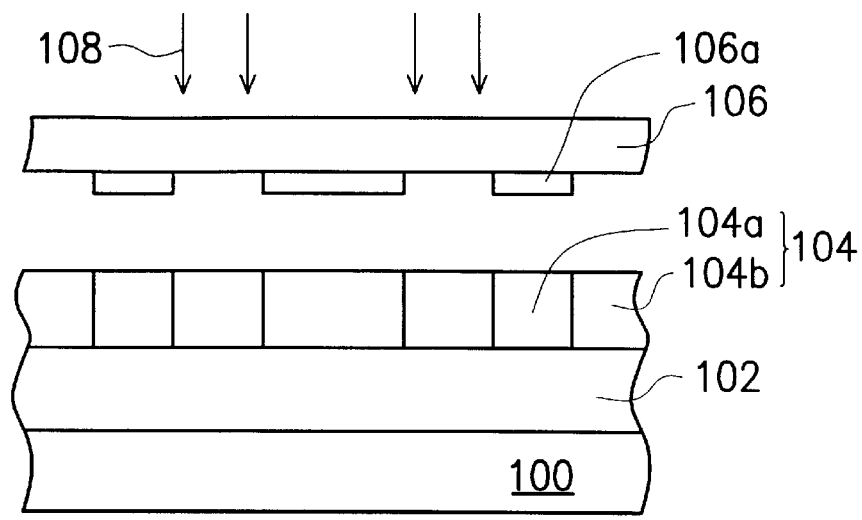
FIGS. 1A through 1C are schematic cross-sectional views showing the progression of steps for performing a thermal flow photolithographic process according to one preferred embodiment of this invention.

Reference will now be made in detail to the present preferred embodiments of the invention, examples of which are illustrated in the accompanying drawings. Wherever possible, the same reference numbers are used in the drawings and the description to refer to the same or like parts.

Figure 1B:
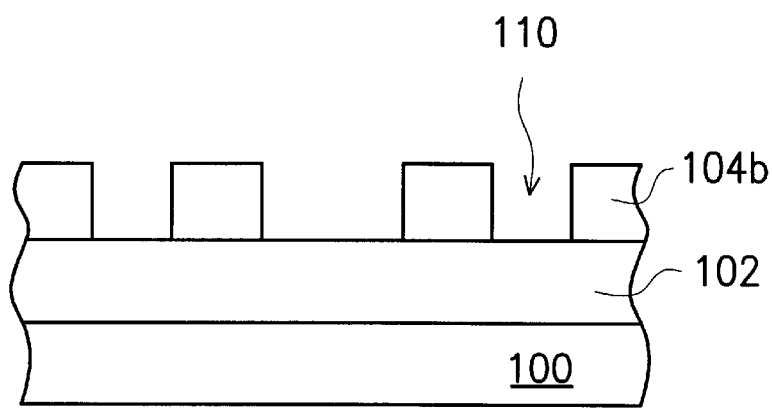
Figure 1C:
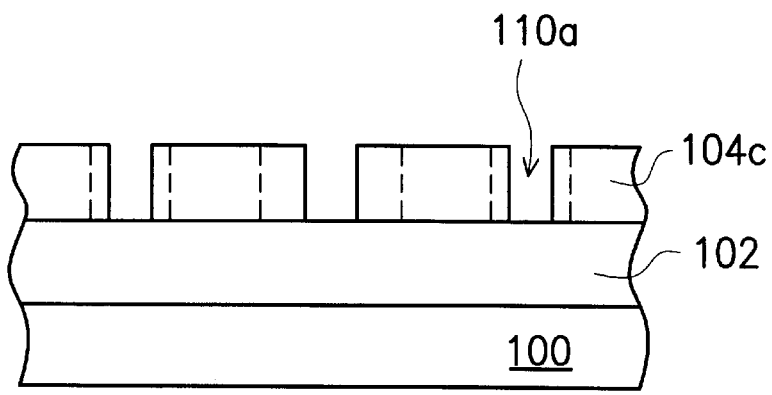

FIGS. 1A through 1C are schematic cross-sectional views showing the progression of steps for performing a thermal flow photolithographic process according to one preferred embodiment of this invention.

As shown in FIG. 1A, a substrate 100 having a plurality of semiconductor devices (not shown) thereon is provided. An insulation layer 102 is formed over the substrate 100. The insulation layer 102 can be a silicon oxide layer or a silicon nitride layer formed, for example, by chemical vapor deposition.

A photoresist layer 104 is formed over the insulation layer 102. The photoresist layer 104 contains polymers having several cross-linking functional groups such as hydroxyl radical. The photoresist material for forming the photoresist layer 104 can be formed, for example, by adding a polymer containing hydroxyl benzoic acid into a high-temperature flow photoresist. Typically, the high-temperature flow cross-linking photoresist contains about 2% to 5% of the cross-linking agent.

A soft baking process of the photoresist layer 104 is carried out. Thereafter, a photo-exposure operation is conducted using a photomask 106 having a pattern 106a so that the pattern 106a is transferred to the photoresist layer 104. Ultimately, an exposed region 104a and an unexposed region 104b are formed in the photoresist layer 104.

As shown in FIG. 1B, a hard baking process is conducted followed by photoresist development. Hence, the photoresist material the unexposed region 104a is removed and an opening 110 that exposes a portion of the insulation layer 102 is formed in the photoresist layer 104.

As shown in FIG. 1C, a thermal flow is conducted to increase the exposed region 104b into an exposed region 104c while the opening 110 shrink to an opening 110a. The thermal flow can be carried out on a hot plate heated to a temperature between 150 C to 160 C. Since the photoresist layer 104 contains polymers of cross-linking functional groups, glass transition temperature of the photoresist material is raised. Hence, the processing window for conducting heat flow of the photoresist material is increased.

Figure 2:
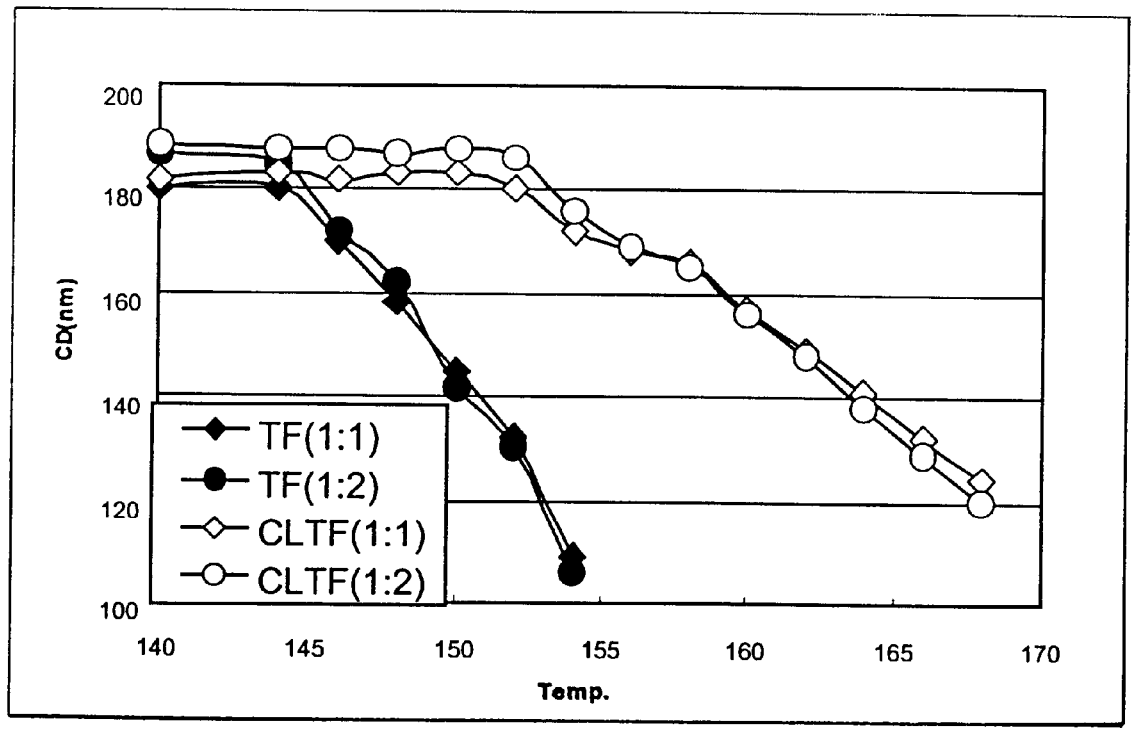
FIG. 2 is a graph showing the relationship of critical dimension versus temperature in a thermal flow process illustrating the difference between a photoresist material without cross-linking polymers and one with cross-linking polymers.

FIG. 2 is a graph showing the relationship of critical dimension versus temperature in a thermal flow process illustrating the difference between a photoresist material without cross-linking polymers and one with cross-linking polymers. As shown in FIG. 2, density of photoresist pattern (in other words, the ratio of opening to between opening region or duty ratio is large or small) has very little effect on thermal flow. However, a conventional thermal flow photoresist has a much bigger temperature sensitivity than photoresist with cross-linked polymers, roughly a change of 16 nm in critical dimension for a temperature increase of 5° C. On the other hand, a change in temperature of the photoresist material with cross-linking polymers leads only to a minor change in critical dimension. Consequently, a larger processing window for carrying out thermal flow is obtained.

In addition, besides increasing glass transition temperature, the cross-linking of polymers also strengthens internal bonding strength of the photoresist layer. Hence, the photoresist layer is less vulnerable to attack by etching agents. Consequently, a higher etching selectivity ratio between the photoresist layer and the insulation layer is obtained.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A thermal flow photolithographic process, comprising the steps of:
   providing a high-temperature flow photoresist;
      adding a cross-linking agent to the high-temperature flow photoresist to form a high-temperature flow cross-linking photoresist material, wherein the cross-linking agent includes a polymer with a hydroxyl benzoic acid configuration;
   providing a substrate having an insulation layer thereon;
   depositing the high-temperature flow photoresist material onto the insulation layer;
   performing a photoresist exposure operation;
   performing a photoresist development operation; and
   performing a thermal flow.

2. The process of claim 1, wherein the step of performing thermal flow includes heating the photoresist material to a temperature between about 150° C. to about 160° C.

3. The process of claim 1, wherein the percentage of the cross-linking agent in the high temperature flow cross-linking photoresist is between about 2% to about 5%.

4. A method for increasing the processing window of a high-temperature flow photolithographic process, comprising:
   providing a substrate having an insulation layer thereon;
      forming a photoresist layer over the insulation layer, the photoresist layer contains a polymer having a plurality of cross-linking functional groups, wherein the cross-linking functional groups include hydroxyl radicals;
   performing a soft baking;
   performing a photoresist exposure operation;
   performing a hard baking;
   performing a photoresist development; and
      performing a thermal flow so that the photoresist layer flows and the polymers within the photoresist layer forms cross-links.

5. The method of claim 4, wherein the polymer has a hydroxyl benzoic acid structure.

6. The method of claim 4, wherein the step of performing thermal flow includes heating the photoresist material to a temperature between about 150° C. to about 160° C.

7. The method of claim 4, wherein the percentage of the cross-linking agent in the high-temperature flow cross-linking photoresist is between about 2% to about 5%.

* * * * *